United States Patent [19]

Sugishima et al.

[11] 4,352,724
[45] Oct. 5, 1982

[54] METHOD OF MANUFACTURING A SEMICONDUCTOR DEVICE

[75] Inventors: Kenji Sugishima; Tadakazu Takada, both of Kawasaki, Japan

[73] Assignee: Fujitsu Limited, Kawasaki, Japan

[21] Appl. No.: 208,391

[22] Filed: Nov. 19, 1980

[30] Foreign Application Priority Data

Nov. 28, 1979 [JP] Japan .................................. 54-154003

[51] Int. Cl.³ .......................... C23C 15/00; C23F 1/00
[52] U.S. Cl. ................................. 204/192 E; 156/643; 156/651
[58] Field of Search ..................... 204/192 E; 156/643, 156/651

[56] References Cited
PUBLICATIONS

W. W. Koste et al., "Via Profiling by Plasma Etching With Varying Ion Energy", *IBM Tech. Disc. Bull.*, vol. 22, pp. 2737-2738, Dec. 1979.

*Primary Examiner*—Aaron Weisstuch
*Attorney, Agent, or Firm*—Staas & Halsey

[57] ABSTRACT

A method of manufacturing a semiconductor device having a multi-layer structure comprises the steps of patterning in accordance with a predetermined pattern a thin film of photoresist formed on a film to be etched which has been formed on a semiconductor substrate, etching the film to be etched partly by an isotropic etching using said patterned film as a mask, completing the etching by an anisotropic etching in the direction of its depth, resulting in tapered or inclined sides on the etched film. The isotropic and anisotropic etchings may be carried out in the same apparatus by changing the reactive gases used in these etchings and/or the conditions of each etching, such as the amount of gas, the gas pressure and the applied radio frequency power.

36 Claims, 12 Drawing Figures

METHOD OF MANUFACTURING A SEMICONDUCTOR DEVICE

BACKGROUND OF THE INVENTION

1. Field of the Invention

The present invention is directed to a method of manufacturing a semiconductor device, and more particularly to a novel method of forming minute and fine patterns by a novel sequence of etchings while avoiding the problems encountered in conventional etchings.

2. Description of the Prior Art

Methods for the manufacture of semiconductor devices are being continuously developed, and improved photolithograhic processes for patterning the substrate surface are fundamentally important. As is generally understood, conventional wet etching techniques using chemicals appear to have reached a limit for precision, and extremely minute patterns are now formed by means of dry etching instead. However, very sharp edges and steps are produced by the dry etching which is now practiced.

Technology for the manufacture of integrated circuits is reviewed these days for the purpose of increasing integration density, so that characteristics such as faster speed of operation, lower dissipation of power and so forth may be improved. While patterns formed on the substrate surface tend to become finely miniaturized, there is a new trend to fabricate integrated circuits in multi-layer structures. As the number of layers increase, from three to four, for example, the steps and differences in height between the levels of adjacent layers increase, resulting in differences in the thickness of layers grown on top of these others, such as in the wiring layers and insulation layers. If the wiring layer becomes very thin at a step, breaking of the wiring layer is likely to happen, and if the insulation layer becomes very thin at a step, wiring layers may easily be short-circuited.

Conventional wet etching which cannot produce fine patterns, has proved to be advantageous compared to dry etching when problems resulting from formation of sharp steps are taken into consideration.

In order to produce fine patterns in a wiring layer for example, a dry etching as is practiced recently becomes necessary. For avoiding steps or edges with sharp corners where the wiring or insulation layer is etched or cut through, a conventional wet etching has been found to be advantageous. But, to obtain a tapered or inclined side of the wiring or insulation layer contradicts the purpose of forming fine patterns. Yet, in the fabrication of densely packed integrated circuits, these two must be attained simultaneously.

Figure 1:
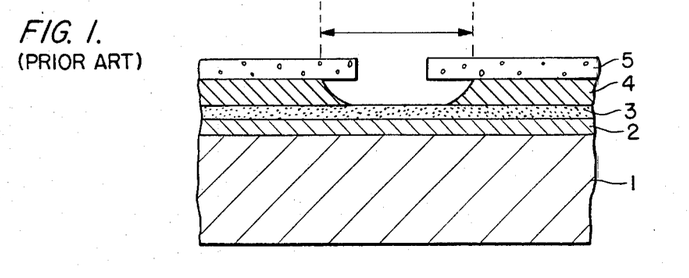
FIG. 1 is a cross-sectional schematic view of a semiconductor device according to the prior art in which an insulation layer on a wiring layer formed on an insulation film grown on a semiconductor substrate is etched by an isotropic etching.

The object of forming fine patterns has been partially accomplished by miniaturization of windows for electrodes and via holes formed in an insulation film on a semiconductor substrate. FIG. 1 schematically illustrates in cross-section a via hole formed by an isotropic etching in a conventional wet etching device or a barrel type dry etching device. A via hole is formed through an insulation layer 4, of phosphosilicate-glass (PSG) for example, reaching to a wiring layer 3, of say aluminum or polycrystalline silicon, formed on an insulation film 2 grown on a semiconductor substrate 1 such as of silicon. The via hole has an opening which is larger than the window in a photoresist film 5 used as a mask. This indicates that an accurate and fine via hole cannot be formed by the known isotropic etching technique.

Figure 2:
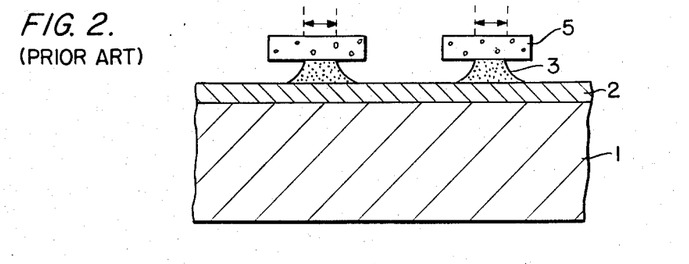
FIG. 2 is a cross-sectional schematic view of a wiring layer etched by a known isotropic etching.

A similar problem is also experienced in forming wiring patterns by a conventional isotropic etching. FIG. 2 shows schematically in cross-section wiring patterns 3 formed on an insulating film 2 grown on a semiconductor substrate 1 of say silicon by an isotropic etching according to known art using a photoresist film 5 as a mask. The width of the upper surface of the wiring layer 3 is smaller than the width of the photoresist film 5 used as a mask.

Figure 3:
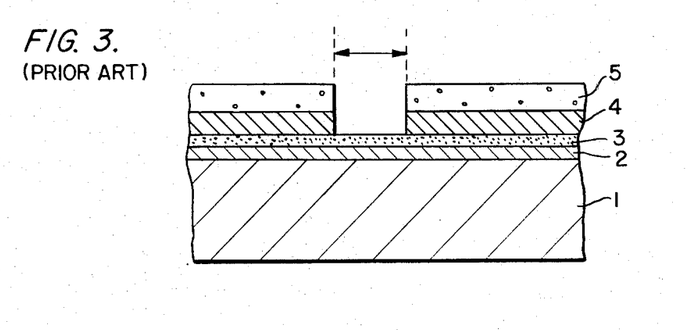
FIG. 3 is a schematic view in cross-section of a structure similar to that shown in FIG. 1, but showing an insulation layer etched by an anisotropic etching.

In order to overcome these problems, a planar type plasma etching device was selected to avoid the side etchings inevitable in isotropic etching. If a via hole is etched into the structure of FIG. 1 using a planar type plasma etching device, the insulation layer 4 of PSG is etched in a direction vertical to the surface of the substrate 1 as shown in FIG. 3. The opening of the via hole thus formed is substantially equal to the opening of the photoresist film 5 used as a mask.

Figure 4:
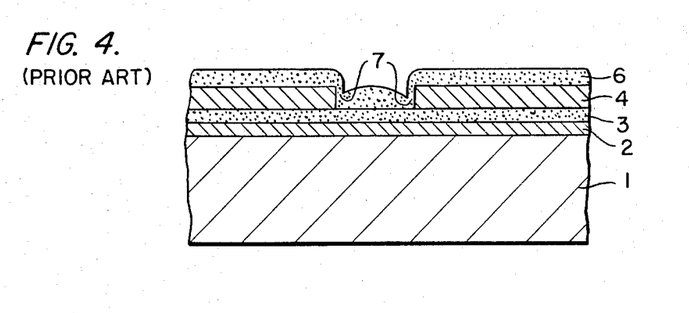
FIG. 4 is a cross-sectional schematic view of a wiring layer formed on the insulation layer shown in FIG. 3.

However, when the photoresist film 5 is removed and a wiring layer 6 of aluminum for example is patterned on the insulation layer 4, the wiring layer 6 covering the insulation layer 4 has thin portions 7 at the step, as shown in FIG. 4, because the edges of the via hole are sharp.

Figure 5:
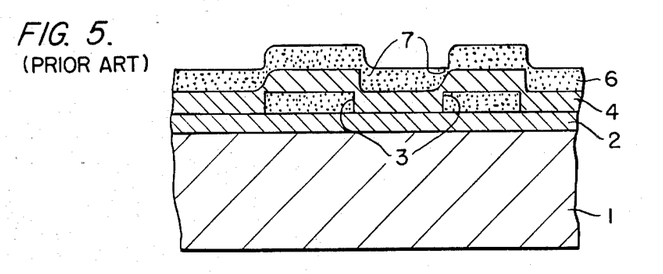
FIG. 5 is a view similar to FIG. 4, but showing wiring layers formed by anisotropic etching of a wiring layer over which are formed an insulation layer and another wiring layer.

FIG. 5 illustrates schematically in cross-section two wiring layers fabricated in accordance with conventional techniques. The wiring layer 3 on the insulation film 2 was formed by a planar type plasma etching device and the wiring layer 6 was patterned on the insulation layer 4. It is seen that the wiring layer 6 may be broken at steps 7. This is due to the sharp or sudden steps formed by anisotropic dry etching carried out when the wiring layers 3 were patterned.

SUMMARY OF THE INVENTION

The present invention concerns a novel method of forming accurately a window for an electrode or a via hole of very small size, which comprises the following steps: a first insulation film of silicon dioxide (SiO$_2$) for example is formed on a semiconductor substrate, a wiring layer of aluminum is formed on the insulation film, and a second insulation layer of phospho-silicate-glass (PSG) for example is formed on the wiring layer. A thin film of positive photoresist to be used as a mask is formed on the second insulation film. A window is cut through the thin film by a known method to prepare for etching of the PSG insulation layer using the thin film of photoresist as a mask. The etching is first an isotropic etching until about one half the depth of the PSG layer is etched, then an anisotropic etching is carried out in the direction of the depth of the layer, that is in a direction perpendicular to the plane of the substrate, until the aluminum wiring layer is exposed. Both the isotropic etching and the anisotropic etching may be carried out for instance in a planar type plasma etching device.

Thus, in the present invention, a process is proposed for resolving the two conflicting objects of forming minute patterns while avoiding defects found in the prior art by producing tapering or inclined sides by a combination of isotropic and anisotropic etching. The method of the present invention may be applied to whatever materials may be etched by any known etching technique, and there may be as many layers as are required. If both the isotropic etching and the anisotropic etching are carried out by a dry etching process, the entire process may be carried out in the same apparatus. This is done by properly selecting the reactive gas and the conditions for each dry etching, such as the amount of reactive gas, the gas pressure, the applied radio frequency power, etc.

It is therefore a general object of the invention to offer a method in the patterning of a layer on a semiconductor substrate comprising the steps of forming a thin film having a predetermined pattern on the layer to be etched, etching the layer partly by an isotropic etching using the thin film as a mask, then etching the layer in the direction of its depth by an anisotropic etching until another underlying layer is exposed, the sides of the etched layer being tapered or inclined, it being understood that an isotropic etching may be effected by a wet etching or a dry etching, and that an anisotropic etching can only be realized by a dry etching.

It is another object of the invention to present a method wherein said isotropic and anisotropic etchings are carried out in the same apparatus by properly selecting the reactive gas and conditions of dry etching such as the amount of gas, the gas pressure and the applied radio frequency power.

The above and further objects and novel features of the invention will appear more fully from the following detailed description when read in connection with the accompanying drawings. It is to be expressly understood, however, that the drawings are not intended as a definition of the invention but are for the purpose of illustration only.

DESCRIPTION OF THE PREFERRED EMBODIMENTS

In patterning a film or layer formed on a semiconductor substrate according to the method of the present invention, etching of the film is partly done by an isotropic etching, then an anisotropic etching is carried out until the patterning is completed. Isotropic etching may be performed by a wet etching or a dry etching while anisotropic etching in the direction of the depth of the film, that is in the direction perpendicular to the surface of the semiconductor substrate, can only be realized by a dry etching. Thus, the method of the present invention may be carried out such as by the following three examples of combinations of etchings:

|  | isotropic etching | anisotropic etching |
| --- | --- | --- |
| (a) | wet etching | dry etching (planar type) |
| (b) | dry etching (barrel type) | dry etching (planar type) |
| (c) | dry etching (planar type) | dry etching (planar type) |

Other combinations are possible, as indicated in the following.

Figure 11:
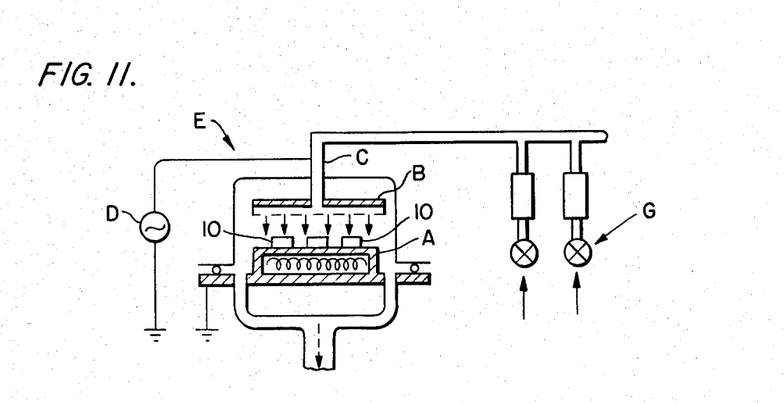
FIGS. 11 and 12 are cross-sectional schematic views of a planar type plasma etching device and a reactive sputter device respectively.
Figure 12:
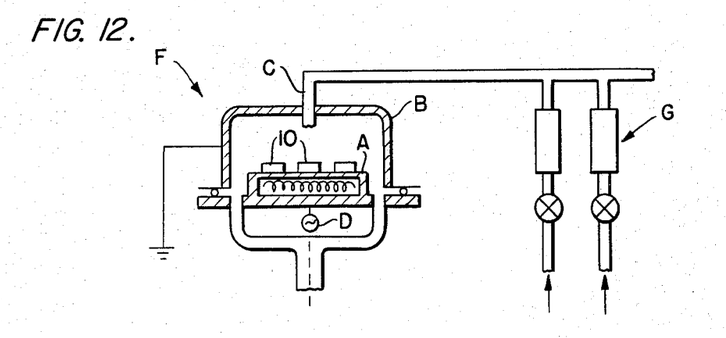

In FIGS. 11 and 12, there are shown schematically in cross-section a planar type plasma etching device E and a reactive sputter etching device or a reactive ion etching device F respectively, both of which can produce the anisotropic etching of the present invention. In either device, semiconductor substrates 10 are placed on an electrode A. Radio frequency power of for instance 13.56 MHz generated by a power source D is applied between the electrode A and an oppositely arranged electrode B. Reactive gas supplied from G (control tap and flow meter) is introduced through an inlet C, and turns into plasma by the applied r.f. power, and the substrates 10 are etched.

Figure 6:
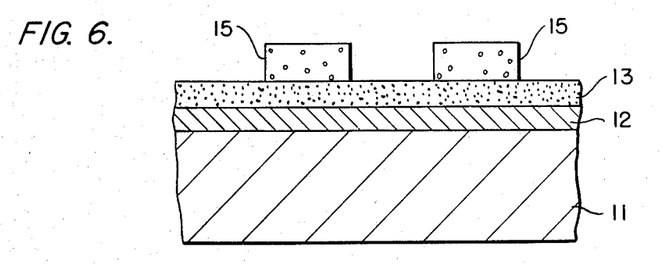
FIGS. 6 to 10 inclusive are cross-sectional schematic views illustrating the steps of the method of the present invention.
Figure 7:
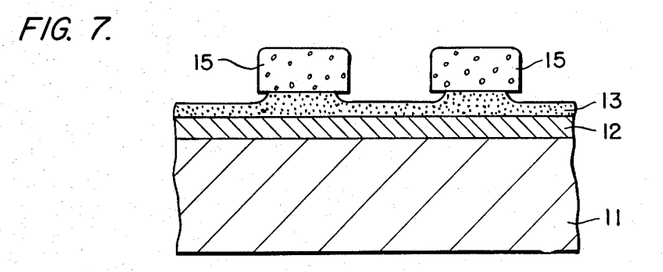

An embodiment of the invention will now be explained referring to FIGS. 6 to 10 inclusive which show schematically in cross-section the steps to carry out the method of the present invention. In FIG. 6 is shown a polycrystalline silicon film 13, with a thickness of say 5,000 Å, which has been grown on an insulation film 12 of silicon dioxide, for example, that was previously grown on a semiconductor substrate 11. The film 13 is coated with a thin film 15 of a positive photographic emulsion or photoresist by a spinning and baking process, the film being shown in a condition after patterning. Using the film 15 as a mask, an isotropic etching was carried out in a planar type device E (FIG. 11) until a thickness of say 2,500 Å is etched away from the film 13 of polycrystalline silicon (FIG. 7). In this embodiment, $CF_4$ gas mixed with 5% $O_2$ was selected as the reactive gas, and the etching conditions included an applied radio frequency power of 1 KW, a gas pressure of 1 Torr, and an etching time of 2.5 minutes. By virtue of isotropic etching, side etchings progressed sideways as shown in FIG. 7, and openings at the upper part of the polycrystalline silicon film 13 were made larger than the opening of the resist film 15. It was also found that by selecting $CF_4$ gas mixed with $C_2F_5Cl$ instead of 5% $O_2$, and by maintaining the gas pressure at 2 Torr, the thickness of 2,500 Å was etched away from the film 13 in 20 seconds using the same radio frequency power.

Figure 8:
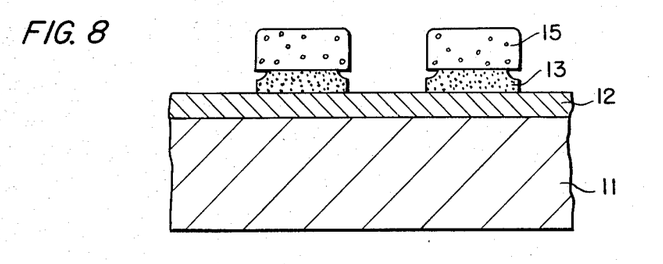

Next, in the same apparatus, an anisotropic etching was carried out to etch away the remaining thickness of the film 13 (FIG. 8). The selected reactive gas was $CCl_4$, and the etching conditions were an r.f. power of 1 KW, a gas pressure of 0.2 Torr and an etching time of 30 seconds. Vertical sides separated by the same distance as the opening of the resist mask were produced by this etching as shown in FIG. 8.

This process just described corresponds to combination (c) mentioned above. The remaining thickness after the isotropic etching may also be etched away by anisotropic etching under other conditions as follows, using again for instance r.f. power of 1 KW:

| kind of gas | gas pressure | etching time |
| --- | --- | --- |
| $CF_4 + C_2F_5Cl$ | 1 Torr | 20 seconds |
| $CF_4 + O_2$ (5%) | 0.1 Torr | 5 minutes |
| $PCl_3$ | 0.2 Torr | 40 seconds |

Figure 9:
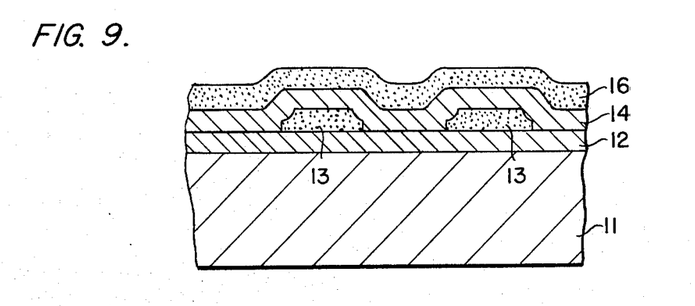

Thus, an isotropic etching is carried out and in the same apparatus an anisotropic etching is subsequently done. A minutely fine pattern having tapered or inclined sides as shown in FIG. 8 is produced as a result. Thereafter, the resist film 15 used as a mask is washed or removed by an organic solvent, and an insulation film 14 of PSG for example is grown on the entire surface as shown in FIG. 9. The insulating film 14 and a wiring layer 16 thereon have uniform thickness devoid of thin parts.

The kind of gas selected plays an important role in etchings carried out in the device shown, with various types of etchants being most effective for different types of etching of different materials. The following tables indicate various types of isotropic and anisotropic etching processes for use in the present invention, with the materials to be etched on the left and the etchants or families of etchants along with appropriate pressure ranges on the right, and wherein the abbreviations employed in the tables include single crystal silicon S-Si, polycrystalline silicon Poly Si, chemical vapor deposition CVD, thermally grown TG, and phospho-silicate-glass PSG.

I. ISOTROPIC ETCHING

Table I.1 Wet etching

| | |
| --- | --- |
| S—Si, Poly Si | $HF—HNO_3$ family |
| CVD $SiO_2$, TG $SiO_2$ | $HF—H_2O$ family |
| PSG | $HF—H_2O$ family |
| Al | $H_3PO_4—HNO_3$ family |

Table I.2 Barrel type plasma etching

| | |
| --- | --- |
| S—Si, Poly Si | $CF_4$, $CF_4 + O_2$, $CF_3Cl + O_2$ |
| CVD $SiO_2$, TG $SiO_2$ | $CF_4$, $CF_4 + O_2$, $CF_3Cl + O_2$ |
| $Si_3N_4$ | $CF_4$, $CF_4 + O_2$, $SiF_4$ |
| PSG | $CF_4$, $CF_4 + O_2$, $CClF_3 + O_2$ |

Table I.3 Planar type plasma etching

| | |
| --- | --- |
| S—Si, Poly Si | $C_2F_5Cl + CF_4$ at 1 Torr or more |
| | $CF_4$ or $CF_4 + O_2$ at 0.1–0.2 Torr or more |
| CVD $SiO_2$, TG $SiO_2$ | $C_2F_5Cl + CF_4$ at 1 Torr or more |
| | $CF_4$ or $CF_4 + O_2$ at 0.1–0.2 Torr or more |
| $Si_3N_4$ | $C_2F_5Cl + CF_4$ at 1 Torr or more |
| | $CF_4$ or $CF_4 + O_2$ at 0.1–0.2 Torr or more |
| PSG | $C_2F_5Cl + CF_4$ at 1 Torr or more |
| | $CF_4$ or $CF_4 + O_2$ at 0.1–0.2 Torr or more |

I.4 Reactive ion etching and reactive sputter etching

| | |
| --- | --- |
| S—Si, Poly Si | $C_2F_5Cl + CF_4$ at 0.1 Torr or more |
| | $CF_4$ or $CF_4 + O_2$ at 0.01–0.02 Torr or more |
| CVD $SiO_2$, TG $SiO_2$ | $C_2F_5Cl + CF_4$ at 0.1 Torr or more |
| | $CF_4$ or $CF_4 + O_2$ at 0.01–0.02 Torr or more |
| $Si_3N_4$ | $C_2F_5Cl + CF_4$ at 0.1 Torr or more |
| | $CF_4$ or $CF_4 + O_2$ at 0.01–0.02 Torr or more |
| PSG | $C_2F_5Cl + CF_4$ at 0.1 Torr or more |
| | $CF_4$ or $CF_4 + O_2$ at 0.01–0.02 Torr or more |

II. ANISOTROPIC ETCHING

II.1 Planar type plasma etching

| | |
| --- | --- |
| $Si_3N_4$, S—Si, Poly Si | $CCl_4$, $PCl_3$, $BCl_3$, $SiCl_4$, and other chloride compound gases |
| | $CF_4$ or $CF_4 + O_2$ at 0.1–0.2 Torr or less |
| | $C_2F_5Cl$ or $C_2F_5Cl + CF_4$ at 1 Torr or less |
| | a mixed gas of at least one of these chloride compound gases with $O_2$ or $CF_4$ |
| | a mixed gas of at least two of these chloride compound gases |
| | a mixed gas of at least one of these chloride compound gas mixtures mixed with $O_2$ or $CF_4$ |
| | $CF_6$ |
| PSG, $Si_3N_4$, CVD $SiO_2$, TG $SiO_2$ | $CF_4$ or $CF_4 + O_2$ at 0.1–0.2 Torr or less |
| | $CF_4 + H_2$, $CHF_3$, $C_2F_6$, $C_3F_8$, $C_4F_8$ |
| Al, Al—Cu, Al—Si, Al—Cu—Si | $CCl_4$, $PCl_3$, $BCl_3$, other chloride compound gases |
| | a mixed gas of at least one of these chloride compound gases |
| | a mixed gas of at least one of these chloride compound gases with $O_2$ or $CF_4$ |
| | a mixed gas of any of these chloride compound gases or mixtures with an inactive gas such as Ar, He, etc. |

II.2 Reactive ion etching and reactive sputter etching

| | |
| --- | --- |
| $Si_3N_4$, S—Si, Poly Si | $CCl_4$, $PCl_3$, $BCl_3$, $SiCl_4$, other chloride compound gases |
| | $CF_4$ or $CF_4 + O_2$ at 0.01–0.02 Torr or less |
| | $C_2F_5Cl$ or $C_2F_5Cl + CF_4$ at 0.1 Torr or less |
| | any of these chloride compound gases with $O_2$ or $CF_4$ |
| | a mixed gas of at least one of these chloride compound gases |
| | a mixed gas of at least one of these chloride compound gas mixtures with $O_2$ or $CF_4$ |
| | $CF_6$ |
| PSG, $Si_3N_4$, CVD $SiO_2$, TG $SiO_2$ | $CF_4$ or $CF_4 + O_2$ at 0.01–0.02 Torr or less |
| | $CF_4 + H_2$, $CHF_3$, $C_2F_6$, $C_3F_8$, $C_4F_8$ |
| Al, Al—Cu, Al—Si, Al—Cu—Si | $CCl_4$, $PCl_3$, $BCl_3$, other chloride compound gases |
| | a mixed gas of at least one of these chloride compound gases |
| | a mixed gas of at least one of these above chloride compound gases with $O_2$ or $CF_4$ |
| | a mixed gas of at least one of these chloride compound gases or mixtures with an inactive gas such as Ar, He, etc. |

In the embodiments described above, polycrystalline silicon was etched according to the method of the present invention. As is seen from the tabulations above, films of thermally grown silicon dioxide or grown by chemical vapor deposition, phospho-silicate-glass (PSG) or single crystal silicon may similarly be etched by merely changing etching times, etc., and the present invention is not limited to the etching of polycrystalline silicon alone. Also with materials other than polycrystalline silicon, both isotropic and anisotropic etchings may be carried out in the same apparatus by selecting a suitable gas and etching condition.

Figure 10:
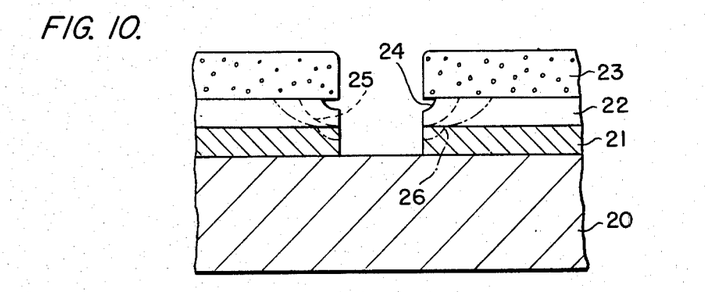

For example, referring to FIG. 10 which shows another embodiment of the present invention, a film 21 of $SiO_2$ is grown on a layer 20. Another film 22 of $Si_3N_4$ is formed on the film 21, and the photoresist film 23 to be used as a mask is formed and patterned on the film 22. It is desired that the opening of this structure where the structure is in contact with the layer 20 be equal to the opening of the resist mask 23. At the same time, in order to avoid formation of steps as seen in FIG. 3, it is desired that the sides of the structure be tapered or inclined as seen in FIG. 9.

This object may be obtained to various degrees as follows. The Si$_3$N$_4$ film 22 may be etched only partly as shown by the line 24. Or the Si$_3$N$_4$ film 22 may be more completely etched as shown by the dotted line 25. Or the Si$_3$N$_4$ film 22 may be further laterally etched along with part of the SiO$_2$ film 21, as shown by the chain line 26. Thus the isotropic etching may remove any substantial amount of a layer being etched to be effective for providing the desired taper according to the present invention. For whichever alternative shown in FIG. 10 is desired, the isotropic etching may be carried out in a planar type plasma etching device using for example a mixed gas of CF$_4$+O$_2$ as shown in Table I.3. This may then be followed by an anisotropic etching using CF$_4$ gas under the pressure of 0.1–0.2 Torr or less, as per Table II.1. Care must be taken when two layers are isotropically etched that the etching rate of the top material must be larger than that of the lower material. Otherwise, the layer of the top material (Si$_3$N$_4$ in this embodiment) will overhang the lower layer (SiO$_2$ in this case).

Where the material to be etched is aluminum, isotropic and anisotropic etchings generally cannot be carried out in a single apparatus. An aluminum film or layer requires that the isotropic etching first be carried out by wet etching, because such etching cannot be realized by dry etching. This isotropic etching is followed by an anisotropic etching in a planar type plasma etching apparatus, for instance using a chloride compound gas such as CCl$_4$, PCl$_3$ or BCl$_3$, or a mixture of these, or said mixture mixed with O$_2$ or CF$_4$, or said mixture mixed with an inactive gas such as argon, helium and the like, etc. This applies also to aluminum alloys such as Al-Cu, Al-Si or Al-Cu-Si. The etching of aluminum according to the present invention thus corresponds to the combination (a) mentioned above.

It will be understood that the method of dry etching suitable for formation of fine patterns according to the present invention enables making tapered or inclined patterns of wiring and insulation layers with more even thicknesses, thus, for instance, preventing breakdowns and short-circuiting, which contributes substantially to improving the reliability of semiconductor devices such as in integrated circuits.

We claim:

1. A method of manufacturing a semiconductor device with a multi-layer structure on a semiconductor substrate to have a more uniform thickness of at least one of the layers, said method comprising the steps of forming a masking film with a predetermined pattern on a selected one of said layers that is to be etched in forming said multi-layer structure,
   isotropically etching each portion of said layer exposed by said pattern to a substantial depth of said selected layer with a respective etchant, leaving at least a lower part of each said exposed portion of said selected layer, said isotropic etching resulting in the removal of at least some of said selected layer underneath said masking film at the edges of said predetermined pattern, and
   completing removal of said selected layer in an area of each said lower part by anisotropic etching so that the lower surface of said selected layer has said predetermined pattern,
   wherein the combination of said etchings result in the selected layer having said predetermined pattern with tapered edges.

2. The method of claim 1, wherein said selected layer is aluminum or an aluminum alloy, said isotropic etching comprises a wet etching using a solution of H$_3$PO$_4$, and said anisotropic etching is a dry etching with a reactive gas chosen from a chloride compound gas, a mixture of at least any two of said chloride compound gases, a mixture of any of said chloride compound gases and mixtures mixed with O$_2$ or CF$_4$, or any of said gases or mixtures mixed with an inactive gas, and said anisotropic etching is conducted in a planar type plasma etching apparatus.

3. The method of claim 2, said inactive gas comprising at least one gas selected from the group consisting of Ar and He.

4. The method of claim 1, said selected layer comprising at least two sub-layers, each sub-layer being of a different material, and each sub-layer having a higher etching rate in said reactive gas than the next-lowest sub-layer.

5. The method of claim 4, said selected layer consisting of two of said sub-layers, the upper sub-layer being Si$_3$N$_4$ and the lower sub-layer being SiO$_2$.

6. The method of claim 1, said isotropic etching comprising wet etching.

7. The method of claim 6, wherein said selected layer is single crystalline or polycrystalline silicon and said respective etchant is selected from the HF-HNO$_3$ family.

8. The method of claim 6, wherein said selected layer is SiO$_2$ or PSG, and said respective etchant is selected from the HF-H$_2$O family.

9. The method of claim 6, wherein said selected layer comprises aluminum, and said respective etchant is selected from the H$_3$PO$_4$-HNO$_3$ family.

10. The method of claim 1, said isotropic etching comprising a barrel type plasma etching.

11. The method of claim 10, wherein said selected layer is single crystal silicon, polycrystalline silicon, or SiO$_2$ and said respective etchant is CF$_4$, CF$_4$+O$_2$, or CF$_3$Cl+O$_2$.

12. The method of claim 10, said selected layer comprising Si$_3$N$_4$, and said respective etchant is CF$_4$, CF$_4$+O$_2$, or SiF$_4$.

13. The method of claim 10, said selected layer comprising PSG, and said respective etchant is CF$_4$, CF$_4$+O$_2$, or CClF$_3$+O$_2$.

14. The method of claim 1, said isotropic etching comprising a planar type plasma etching.

15. The method of claim 14, wherein said selected layer is single crystal silicon, polycrystalline silicon, SiO$_2$, Si$_3$N$_4$, or PSG and said respective etchant is C$_2$F$_5$Cl+CF$_4$ at a gas pressure of at least 1 Torr, or CF$_4$ or CF$_4$+O$_2$ at a gas pressure of at least 0.1 Torr.

16. The method of claim 1, said isotropic etching selectively comprising reactive ion etching and reactive sputter etching.

17. The method of claim 16, wherein said selected layer is single crystal silicon, polycrystalline silicon, SiO$_2$, Si$_3$N$_4$, or PSG and said respective etchant is C$_2$F$_5$Cl+CF$_4$ at a gas pressure of at least 0.1 Torr, or CF$_4$ or CF$_4$+O$_2$ at a gas pressure of at least 0.01 Torr.

18. The method of claim 1, said anisotropic etching selectively comprising reactive ion etching and reactive sputter etching.

19. The method of claim 18, wherein said selected layer is $Si_3N_4$, single crystal silicon or polycrystalline silicon, and wherein said reactive gas is:

a chloride compound gas;

$CF_4$ or $CF_4+O_2$ at a maximum gas pressure of 0.02 Torr;

$C_2F_5Cl$ or $C_2F_5Cl+CF_4$ at a maximum gas pressure of 0.1 Torr;

a gas mixture of at least one chloride compound gas mixed with $O_2$ or $CF_4$;

a gas mixture of any two chloride compound gases;

a gas mixture of at least one of said chloride compound gases or mixtures mixed with $O_2$ or $CF_4$; or $C_2F_6$.

20. The method of claim 19, wherein each said chloride compound gas is $CCl_4$, $PCl_3$, $BCl_3$ or $SiCl_4$.

21. The method of claim 18, wherein the material of said selected layer is PSG, $Si_3N_4$ or $SiO_2$, and wherein said reactive gas is:

$CF_4$ or $CF_4+O_2$ at a maximum gas pressure of 0.02 Torr;

$CF_4+H_2$, $CHF_3$, $C_2F_6$, $C_3F_8$, or $C_4F_8$.

22. The method of claim 18, wherein the material of said selected layer is aluminum or aluminum alloy, and wherein said reactive gas is:

a chloride compound gas;

a gas mixture of at least two of said chloride compound gases;

a gas mixture of at least one of said chloride compound gases with $O_2$ or $CF_4$; or a gas mixture of any of said gases and mixtures with an inactive gas.

23. The method of claim 1, 10, 14, 16, or 18, both said isotropic and anisotropic etching comprising a dry etching process with a respective reactive gas, both said isotropic and anisotropic etchings comprising applying radio frequency power to said reactive gases, said method comprising performing said isotropic and anisotropic etchings in the same dry etching apparatus by selecting the respective reactive gases and the conditions of each said etching, including the amount and pressure of each said gas in each said etching.

24. The method of claim 23, wherein said selected layer is single crystal silicon, polycrystalline silicon, or $Si_3N_4$, said reactive gas of said isotropic etching is $CF_4$, $CF_4+O_2$ or $C_2F_5Cl+CF_4$, and said reactive gas of said anisotropic etching is a chloride compound gas, $CF_4$, $CF_4+O_2$, a mixture of at least one chloride compound gas with $O_2$ or $CF_4$, a mixture of at least two chloride compound gases, any of said gas mixtures mixed with $O_2$ or $CF_4$, or $C_2F_6$.

25. The method of claim 24, wherein said chloride compound gas is $CCl_4$, $PCl_3$, $BCl_3$, $SiCl_4$, or $C_2F_5Cl$, and said chloride compound mixture with $O_2$ comprises 5% $O_2$.

26. The method of claim 23, wherein said apparatus comprises a planar type plasma etching apparatus, said selected layer is of phospho-silicate-glass, $Si_3N_4$ or chemically vapor deposited or thermally grown $SiO_2$, said reactive gas of said isotropic etching is $C_2F_5Cl+CF_4$, $CF_4$ or $CF_4+O_2$, and the reactive gas for said anisotropic etching is $CF_4$, $CF_4+O_2$, $CF_4+H_2$, $CHF_3$, $C_2F_6$, $C_3F_8$ or $C_4F_8$.

27. The method of claim 1, 6, 10, 14 or 16, said anisotropic etching comprising a planar type plasma etching.

28. The method of claim 27, wherein said selected layer is $Si_3N_4$, single crystal silicon, or polycrystalline silicon, and said reactive gas is:

a chloride compound gas;

$CF_4$ or $CF_4+O_2$ at a maximum gas pressure of 0.2 Torr;

$C_2F_5Cl$ or $C_2F_5Cl+CF_4$ at a maximum gas pressure of 1 Torr;

a gas mixture of any of said chloride compound gases with $O_2$ or $CF_4$;

a gas mixture of at least two of said chloride compound gases;

a gas mixture of any of said gases and mixtures with $O_2$ or $CF_4$; or $C_2F_6$.

29. The method of claim 28, wherein each said chloride compound gas is $CCl_4$, $PCl_3$, $BCl_3$, or $SiCl_4$.

30. The method of claim 27, wherein said selected layer is PSG, $Si_3N_4$ or $SiO_2$, and wherein said reactive gas is:

$CF_4$ or $CF_4+O_2$ at a gas pressure of at least 0.1 Torr; $CF_4+H_2$, $CHF_3$, $C_2F_6$, $C_3F_8$, or $C_4F_8$.

31. The method of claim 27, wherein the material of said selected layer is aluminum or an aluminum alloy, and wherein said reactive gas is:

a chloride compound gas;

a gas mixture of at least two chloride compound gases;

a gas mixture of any of said gases and mixtures with $O_2$ or $CF_4$; or a gas mixture of any of said gases and mixtures with an inactive gas.

32. The method of claim 31, wherein each said chloride compound gas is $CCl_4$, $PCl_3$ or $BCl_3$.

33. The method of claim 31, wherein said aluminum alloy is Al-Cu, Al-Si or Al-Cu-Si.

34. The method of claim 22, said isotropic and anisotropic etching comprising a dry etching process with a respective reactive gas, both said isotropic and anisotropic etchings comprising applying radio frequency power to said reactive gases, said method comprising performing said isotropic and anisotropic etchings in the same dry etching apparatus by selecting the respective reactive gases and the conditions of each said etching, including the amount and pressure of each said gas in each said etching.

35. The method of claim 2 or 22 wherein each said chloride compound gas is $CCl_4$, $PCl_3$ or $BCl_3$.

36. The method of claim 2 or 22 wherein said aluminum alloy is Al-Cu, Al-Si or Al-Cu-Si.

* * * * *

UNITED STATES PATENT AND TRADEMARK OFFICE
CERTIFICATE OF CORRECTION

PATENT NO. : 4,352,724

DATED : 5 October 1982

INVENTOR(S) : KENJI SUGHISHIMA et al

It is certified that error appears in the above-identified patent and that said Letters Patent is hereby corrected as shown below:

```
Column 5,      line 19, "device" should be --devices--.
Claim 34,      line 1, "22" should be --27--.
```

Signed and Sealed this

Eighth Day of March 1983

[SEAL]

Attest:

GERALD J. MOSSINGHOFF

Attesting Officer

Commissioner of Patents and Trademarks

REEXAMINATION CERTIFICATE (3213rd)

United States Patent [19]

Sugishima et al.

[11] B1 4,352,724

[45] Certificate Issued Jun. 10, 1997

[54] METHOD OF MANUFACTURING A SEMICONDUCTOR DEVICE

[75] Inventors: Kenji Sugishima; Tadakazu Takada, both of Kawasaki, Japan

[73] Assignee: Fujitsu Limited, Kawasaki, Japan

Reexamination Requests:
No. 90/004,004, Nov. 2, 1995
No. 90/004,360, Sep. 12, 1996

Reexamination Certificate for:
Patent No.: 4,352,724
Issued: Oct. 5, 1982
Appl. No.: 208,391
Filed: Nov. 19, 1980

Certificate of Correction issued Mar. 8, 1983.

[30] Foreign Application Priority Data

Nov. 28, 1979 [JP] Japan ............... 54-154003

[51] Int. Cl.$^6$ ............... H01L 21/302; H05H 1/00; C23C 15/00; C23F 1/00
[52] U.S. Cl. ............... 204/192.37; 156/643.1; 156/651.1; 216/72
[58] Field of Search ............... 156/643.1, 644.1, 156/651.1, 652.1, 653.1, 654.1, 655.1, 656.1, 657.1, 659.11; 216/72; 204/192.35, 192.37

[56] References Cited

U.S. PATENT DOCUMENTS

| | | | |
|---|---|---|---|
| 3,880,684 | 4/1975 | Abe | 156/646.1 |
| 3,986,912 | 10/1976 | Alcorn et al. | 156/643.1 |
| 4,149,904 | 4/1979 | Jones | 437/36 |
| 4,214,946 | 7/1980 | Forget et al. | 156/643.1 |
| 4,293,375 | 10/1981 | Neukomm | 216/49 |
| 4,436,583 | 3/1984 | Saiki et al. | 156/659.11 |

FOREIGN PATENT DOCUMENTS

| | | |
|---|---|---|
| 1059882 | 8/1979 | Canada . |
| 0015403 | 2/1980 | European Pat. Off. . |
| 2340442 | 2/1975 | Germany . |
| 2632093 | 3/1977 | Germany . |
| 2727788 | 1/1978 | Germany . |
| 2730156 | 2/1978 | Germany . |
| 2845460 | 4/1979 | Germany . |
| 52-40978 | 3/1977 | Japan . |
| 52-141443 | 11/1977 | Japan . |
| 53-13372 | 2/1978 | Japan . |
| 53-116090 | 10/1978 | Japan . |
| 54-61475 | 5/1979 | Japan . |
| 54-87172 | 7/1979 | Japan . |
| 58-108229 | 6/1983 | Japan . |
| 1398019 | 6/1975 | United Kingdom . |

OTHER PUBLICATIONS

C.J. Mogab and W.R. Harshbarger, "Plasma process set to etch finer lines with less undercutting", Electronics, Aug. 31, 1978, pp. 117–121.

P.D. Parry and A.F. Rodde, "Anisotropic Plasma Etching of Semiconductor Materials", Solid State Technology, Apr. 1979, pp. 125–132.

Schwartz and Schaible, "Reactive ion etching of silicon", Journal of Vacuum Science Technology, 16(2), Mar./Apr. 1979, pp. 410–413.

R.A. Gdula, "$SF_6$ rei of polysilicon", Extended Abstracts of the Journal of the Electrochemical Society, vol. 79–2, 14–19th Oct. 1979, abstract No. 608, pp. 1524–1526.

(List continued on next page.)

*Primary Examiner*—Aaron Weisstuch

[57] ABSTRACT

A method of manufacturing a semiconductor device having a multi-layer structure comprises the steps of patterning in accordance with a predetermined pattern a thin film of photoresist formed on a film to be etched which has been formed on a semiconductor substrate, etching the film to be etched partly by an isotropic etching using said patterned film as a mask, completing the etching by an anisotropic etching in the direction of its depth, resulting in tapered or inclined sides on the etched film. The isotropic and anisotropic etchings may be carried out in the same apparatus by changing the reactive gases used in these etchings and/or the conditions of each etching, such as the amount of gas, the gas pressure and the applied radio frequency power.

OTHER PUBLICATIONS

T.A. Bartush et al., Sidewall Tailoring Using Two Different Reactive Ion Etchants In Succession; IBM Technical Disclosure Bulletin, 1977, p. 1388.

Darwall, E.C.D., The Control of Plasma Etched Edge Profiles, 1046a Extended Abstracts, vol. 77–2, (1977–10), pp. 400–401, The Plessey Company Limited, Northamptonshire, England.

Gdula, R.A., $SF_6$ RIE Of Polysilicon, 1046B Extended Abstracts, vol. 79–2, Oct. 14–19, 1979, pp. 1524–1526, Princeton, New Jersey.

Turnbull, R.C., Tapering Metallurgy Edges, IBM Technical Disclosure Bulletin, vol. 15, No. 5, Oct. 1972, p. 1620.

Bersin, Richard L., Chemically Selective, Anisotropic Plasma Etching, Solid State Technology, Apr. 1978, pp. 117–121.

Bersin, Richard L., A Survey of Plasma–Etching Processes, Solid State Technology, May 1976, pp. 31–36.

Ono, Hiroshi et al., A New Technology For Tapered Windows In Insulating Films, J. of the Electrochem. Soc., Mar. 1979, pp. 504–506.

Porter, R.A. et al., Plasma Etching Of Phosphosilicate Glass, 1046B Extended Abstracts (1978) Oct., No. 2, Pennington, New Jersey, pp. 515–516.

Harshbarger, W.R., Plasma Assisted Etching For VLSI, 1046B Extended Abstracts (1978) Oct., No. 2, Pennington, New Jersey, pp. 509–511.

Bondur, J.A. et al., Step Coverage Process With Projection Printing And Reactive Ion Etching, IBM Technical Disclosure Bulletin, vol. 19, No. 9, Feb. 1977, pp. 3415–3416.

Bassous, Ernest, Fabrication Of Novel Three–Dimensional Microstructures By The Anisotropic Etching Of (100) And (110) Silicon, IEEE Transactions On Electron Devices, vol. ED–25, No. 10, Oct. 1978, pp. 1178–1185.

Koste, W.W. et al., Via Profiling By Plasma Etching With Varying Ion Energy, IBM Technical Disclosure Bulletin, vol. 22, No. 7, Dec. 1979, pp. 2737–2738.

Kalter, H. et al., Plasmaätzen In Der IC–Technologie, Philips techn. Rdsch. 38, 203–214, 1979, pp. 203–214.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–22, 27–33 and 35–36 is confirmed.

Claims 23–26 and 34 are cancelled.

New claim 37 is added and determined to be patentable.

37. *A method of manufacturing a semiconductor device with a multi-layer structure on a semiconductor substrate so as to have a more uniform thickness of at least one of the layers of the multi-layer structure, said method comprising the steps of*

*selecting a layer that is to have one or more holes etched therethrough to thereby present a predetermined pattern at a lower surface of said selected layer,*

*forming a masking film with said predetermined pattern on said selected layer thereby presenting one or more exposed areas of said selected layer to be etched through in forming said one or more holes in the selected layer of the multi-layer structure,*

*isotropically etching each exposed area of said selected layer to a substantial depth of said selected layer with an etchant to thereby remove an upper portion of said selected layer at each exposed area, thereby leaving at least a lower portion of said selected layer unremoved at each said exposed area of said selected layer, said isotropic etching resulting in the removal of at least some of said selected layer underneath said masking film at the edges of each exposed area of the selected layer,*

*completing removal of said selected layer at each said exposed area of the selected layer by removing the lower portion of the selected layer by anisotropic etching to thereby present said one or more holes so that the lower surface of said selected layer has said predetermined pattern thereby exposing a segment of a layer underlying said selected layer having the shape of said predetermined pattern,*

*wherein the combination of said etchings result in the selected layer having said predetermined pattern at the lower surface thereof and with the etched holes therein having sidewalls which extend upwardly through said lower portion of the selected layer and which are tapered upwardly and outwardly through said upper portion of the selected layer, and*

*forming said at least one of the layers of said multi-layer structure over said selected layer, said at least one of the layers of the multi-layer structure having a first part that contacts said segment of said underlying layer throughout the entire extent of said segment and a second part that extends over said sidewalls of the holes thereby establishing said more uniform thickness in said at least one of the layers of the multi-layer structure.*

* * * * *